(12) United States Patent
Liu

(10) Patent No.: US 7,253,028 B2
(45) Date of Patent: Aug. 7, 2007

(54) IMAGE SENSOR PACKAGING METHOD AND STRUCTURE THEREOF

(75) Inventor: Hua-Hsiang Liu, Hsin-Chu (TW)

(73) Assignee: Youngtek Electronics Corp., Hsin-Chu (TW)

( * ) Notice: Subject to any disclaimer, the term of this patent is extended or adjusted under 35 U.S.C. 154(b) by 224 days.

(21) Appl. No.: 10/948,297

(22) Filed: Sep. 24, 2004

(65) Prior Publication Data

US 2006/0073630 A1    Apr. 6, 2006

(51) Int. Cl.
*H01L 21/64* (2006.01)
*H01L 21/784* (2006.01)

(52) U.S. Cl. .......................................... 438/116; 438/26

(58) Field of Classification Search ................. 438/22, 438/26, 33, 106, 112, 116, 127
See application file for complete search history.

(56) References Cited

U.S. PATENT DOCUMENTS 6,285,064 B1    9/2001  Foster 6,995,462 B2 *  2/2006  Bolken et al. ............... 257/680
2006/0093811 A1 *  5/2006  Ookawa ..................... 428/343

* cited by examiner

*Primary Examiner*—M. Wilczewski
*Assistant Examiner*—Pamela E Perkins

(57) ABSTRACT

A method for packaging an image sensor includes the steps of providing a substrate, forming a first adhesive on one surface of the substrate, attaching a transparent material on the first adhesive, cutting or carving the surface of the transparent material to a depth penetrating the transparent material while not penetrating the first adhesive, cleaning the cut or carved surface of the transparent material, depositing a frame glue on the transparent material, and combining the transparent material with a microchip that includes a plurality of micro-lenses. The micro-lens is packaged within the transparent material. The microchip is then ground to perform a lithography process. Next, the substrate and part of the first adhesive are detached after the lithography process. After performing a cutting or carving procedure, the packaging process of the image sensors is completed.

14 Claims, 6 Drawing Sheets

IMAGE SENSOR PACKAGING METHOD AND STRUCTURE THEREOF

BACKGROUND OF THE INVENTION

The present invention relates generally to an image sensor packaging method and structure thereof, and more particularly to an image sensor packaging method that fabricates first a transparent layer of the image sensor, and then combines the image sensor with a microchip. The image sensor is thus automatically fabricated, thereby preventing the damage or waste of microchips and lowering the manufacturing cost and thickness of the image sensor. When cutting or carving the transparent layer, the amount of fragmental pieces generated is reduced, thus improving the conventional method for manufacturing image sensors.

In recent years, the prosperity of multimedia industry has made a trend of digitizing image data. The development of digital cameras, digital video cameras, image scanners, etc. represents that the age of digital images has arrived. The key component of the products listed above is an image sensor, which is one kind of electro-optical device in the electro-optical industry. The grand integration of video, audio, and digital communications in different platforms has sketched a new shape of people's life along the development of the computer network technology. Therefore, many different products that can exchange image data and information, such as personal computer, personal digital assistant, handheld personal computer, cellular phone, interactive television, web machine, facsimile machine, etc., have been developed.

In general, the image sensor is classified into three different categories, namely, the charge coupling device (CCD) image sensor, the complementary metal oxide semiconductor (CMOS) image sensor, and the contact image sensor (CIS). In practice, since the CIS does not constitute the optical focusing problem of the CCD image sensor, it is often used in a facsimile machine and an image scanner. Thus, the CIS will replace the CCD image sensor to become a standard image sensor used in intermediate or lower level scanners.

However, the quality of the image sensors described above depends mainly on the manufacturing processes and the costs. For example, in the U.S. Pat. No. 6,285,064, which is entitled "Chip Scale Packaging for Optical Image Sensor Integrated Circuits", a manufacturing process is disclosed. In the manufacturing process, a plurality of micro lenses is applied onto a wafer. The wafer includes a plurality of image sensor integrated circuits. The micro lenses are applied to a sensing array portion of the image sensor integrated circuits. Then, an adhesive matrix is applied on the wafer. The adhesive matrix includes a plurality of openings located to correspond to the sensing array portion when the adhesive matrix is applied to the wafer. Next, a cover glass is applied on the adhesive matrix such that a cavity containing a non-adhesive material is formed over the micro lenses. One advantage of the image sensor packaging method is in that the distortion and decay of the received images can be reduced. However, after applying the cover glass, one still needs to planarize and cut the wafers. This will damage the wafer or increase the damage rate. In addition, cutting the cover glass will leave many glass particles on the image sensor. Therefore, defective products are easily derived from the manufacturing processes. Moreover, the manufacturing cost is relatively higher, too.

BRIEF SUMMARY OF THE INVENTION

The present invention is to provide a method for packaging an image sensor and the structure thereof. In the present invention, a transparent layer is fabricated first and then combined with a microchip. The image sensor can thus be produced in an automatic manufacturing process to prevent microchips from being damaged. Consequently, the manufacturing cost and the thickness of the image sensor are reduced. When cutting or carving the transparent layer, the amount of fragmental pieces generated is also reduced.

In order to achieve the above objective, the method of the present invention includes the steps of: providing a substrate, forming a first adhesive on one surface of the substrate, and attaching a transparent material on the first adhesive; cutting or carving the surface of the transparent material to a depth penetrating the transparent material while not penetrating the first adhesive; cleaning the cut or carved surface of the transparent material, and depositing a frame glue on the transparent material; and combining the transparent material with a microchip that includes a plurality of micro-lenses, wherein the micro-lens is packaged within the transparent material. The microchip is then ground and undergoes a lithography process. Next, the substrate and part of the first adhesive after the lithography process are detached. After performing a cutting or carving procedure, the packaging process of the image sensors is completed.

DETAILED DESCRIPTION OF THE INVENTION

In order to better understanding the features and technical contents of the present invention, the present invention is hereinafter described in detail by incorporating with the accompanied drawings. However, the accompanied drawings are only for the convenience of illustration and description, no limitation is intended thereto.

Figure 1:
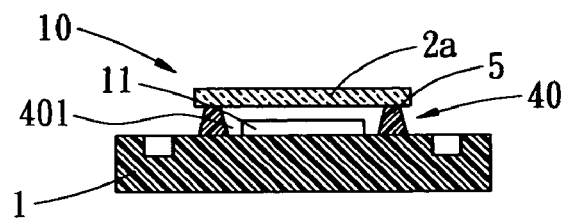
FIG. 1 illustrates an image sensor of the present invention.

Referring to FIG. 1, a packaged image sensor of the present invention is illustrated. As shown, the image sensor packaging method and the structure thereof of the present invention, contrary to the conventional contact image sensor (CIS), is characterized in that the transparent material 2a covered on the wafer 1 is manufactured in a different packaging process. The transparent material 2a combines with the microchip 1 only after the transparent material 2a is manufactured. Such packaging method enables automatic production of the image sensor and prevents the microchip 1 from being damaged, so as to lower the manufacturing cost and the thickness of the image sensor 10. Furthermore, the amount of fragmental pieces derived from cutting or carving the transparent material 2a is reduced, which can largely improve the manufacturing process of the image sensor.

Figure 2:
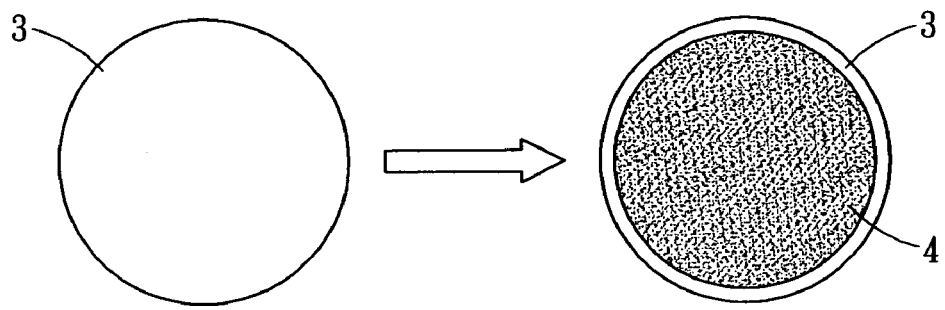
FIG. 2 to FIG. 4 illustrate the process of substrate gluing and combining with a transparent material, according to the present invention.
Figure 3:
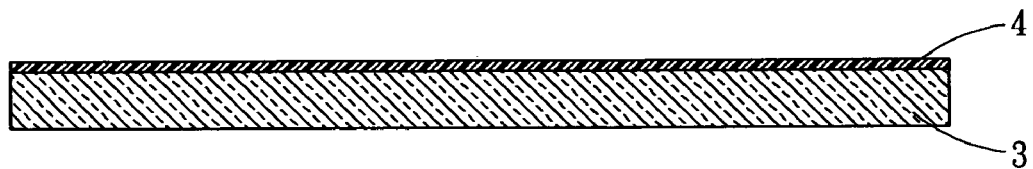
Figure 4:
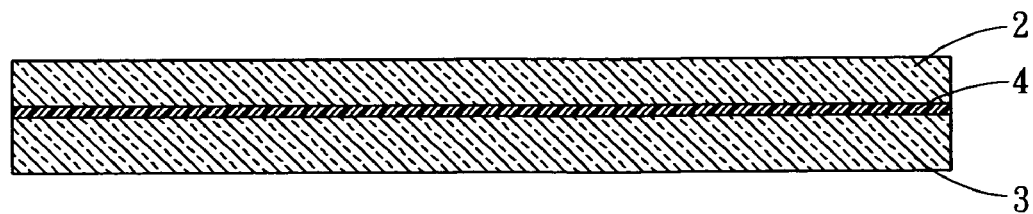

Referring to FIG. 2 to FIG. 4, the process of substrate gluing and combining with a transparent material is illustrated. As shown, a substrate 3 is selected to initiate the packaging of the image sensor 10. The substrate 3 can be made of transparent materials such as glass. A first adhesive 4 is formed on one surface of the substrate 3. The first adhesive 4 can be a ultraviolet curable two-sided glue or a transparent thermally solvable two-sided glue.

After the first adhesive is formed on one surface of the substrate 3, the transparent material 2 is aligned and attached on the first adhesive 4, thereby completing the combination of the transparent material and the substrate 3. The transparent material 2 is made of glass that can penetrate light therethrough.

Figure 5:
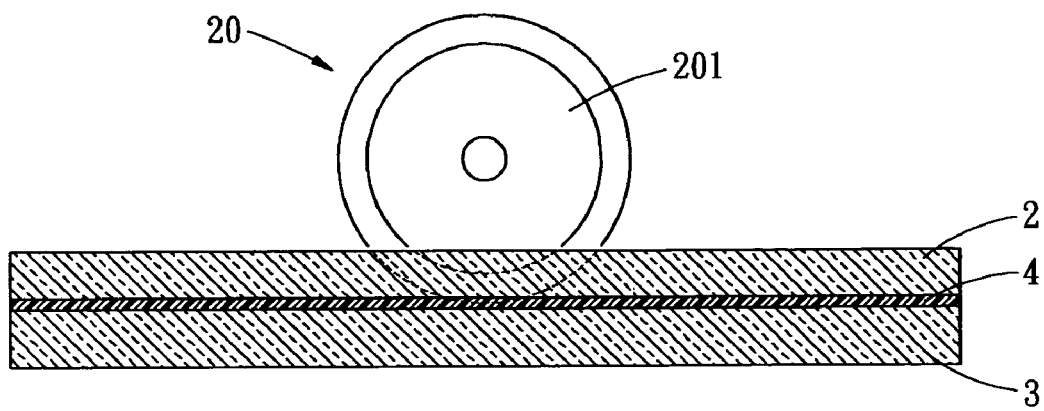
FIG. 5 to FIG. 7 illustrate the process of cutting or carving the transparent material, according to the present invention.
Figure 6:
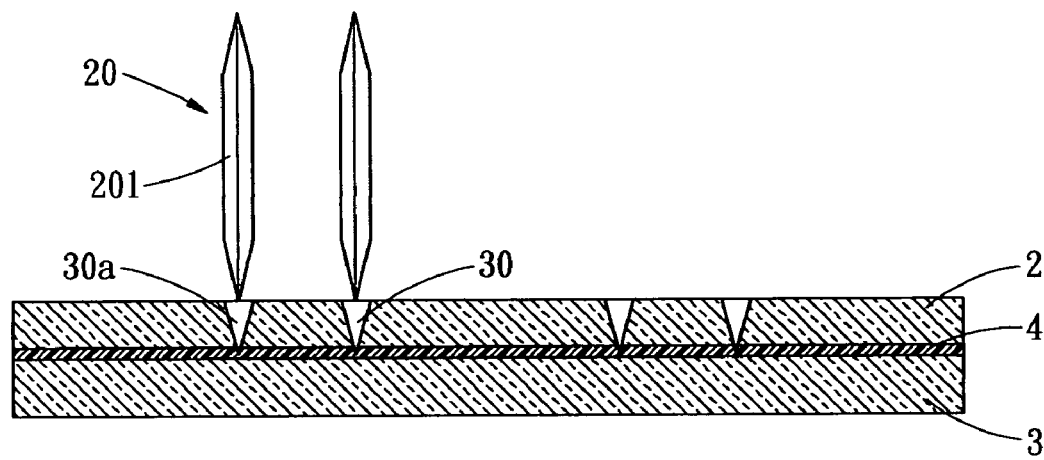
Figure 7:
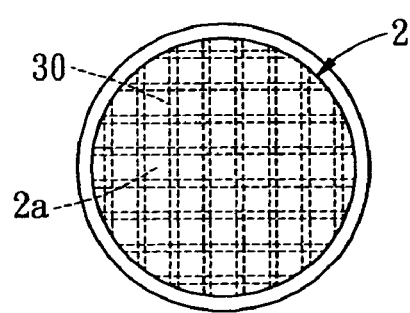

Referring to FIG. 5 to FIG. 7, the process of cutting the transparent material is illustrated. As shown, after combining the transparent material 2, the substrate 3 and the first adhesive 4, the surface of the transparent material 2 is cut. The combination of the transparent material 2, the substrate 3 and the first adhesive 4 is transferred to a die cutting machine 20. By employing the rotating cutter 201 of the cutting machine 20, such as a diamond cutter, the surface of the transparent material 2 is vertically and horizontally cut or carved. The cutting or carving marks 30, 30a goes through the transparent material 2 but does not go through the first adhesive 4. After completing the cutting or carving of the transparent material 2, a plurality of transparent regions 2a is formed on the transparent material 2, and is arranged as an array.

Figure 8:
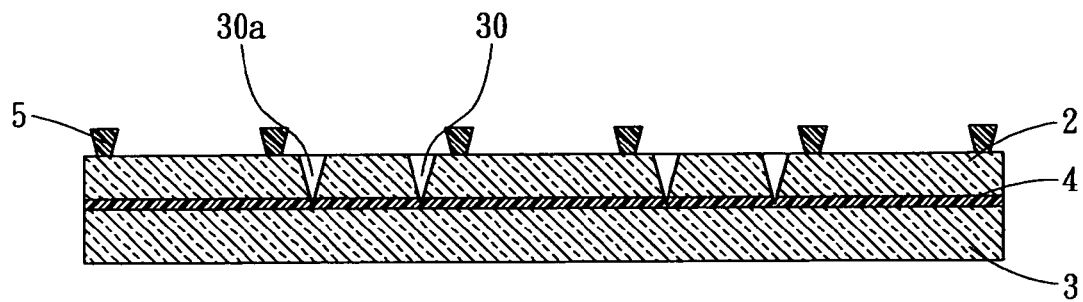
FIG. 8 to FIG. 10 illustrate the process of cutting or carving and printing (spraying or dispensing) the combination of transparent material, substrate and the first adhesive, and combining with a microchip, according to the present invention.
Figure 9:
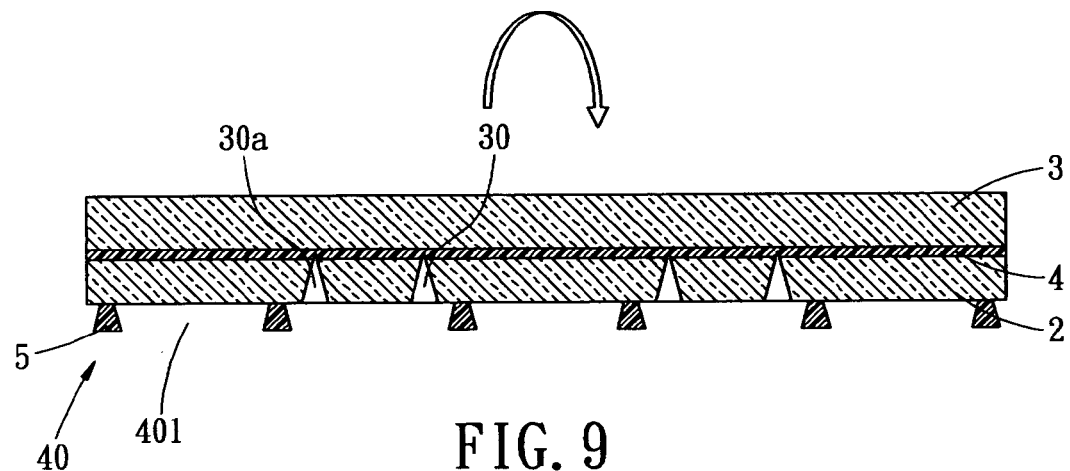
Figure 10:
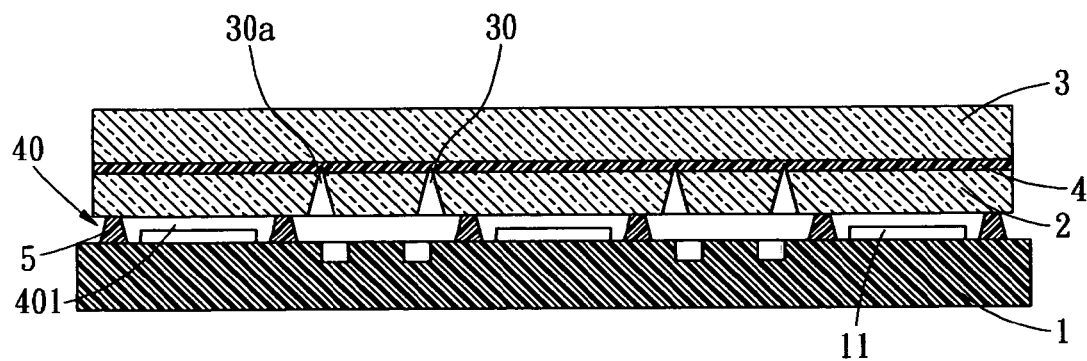

Referring to FIG. 8 to FIG. 10, the process of cutting or carving and printing (spraying or dispensing) the combination of transparent material, substrate and the first adhesive, and combining with a microchip, is illustrated. As shown, after cutting the surface of the transparent material 2, the surface of the entire transparent material 2 is cleaned by means of ultrasonic technique. After the transparent material 2 is cleaned, a frame glue is deposited on the transparent material 2. The frame glue is made of an epoxy material of the second adhesive 5, which is homogeneously printed (sprayed or dispensed) on each transparent region 2a of the transparent material. Consequently, a shielding layer 40 is thus formed, and a space 401 is formed between the shielding layer 40 and the transparent regions 2a. This completes the process of manufacturing the transparent layer.

After the transparent material is printed (sprayed or dispensed), the substrate is turned up side down and is aligned with a plurality of micro-lenses 11 of a microchip 1. The space 401 of the shielding layer 40 covers the micro-lenses 11 of the microchip 1, allowing the micro-lenses 11 being packaged in the space 401.

Figure 11:
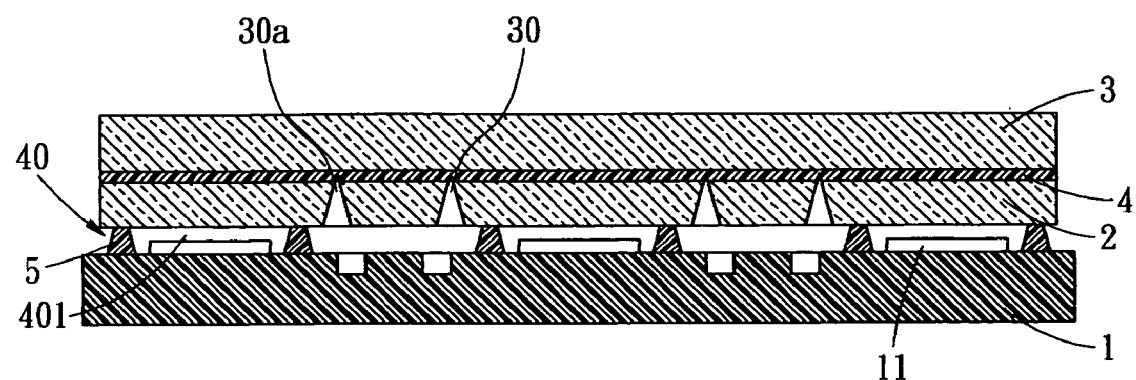
FIG. 11 and FIG. 12 illustrate the grinding of microchip thickness, according to the present invention.
Figure 12:
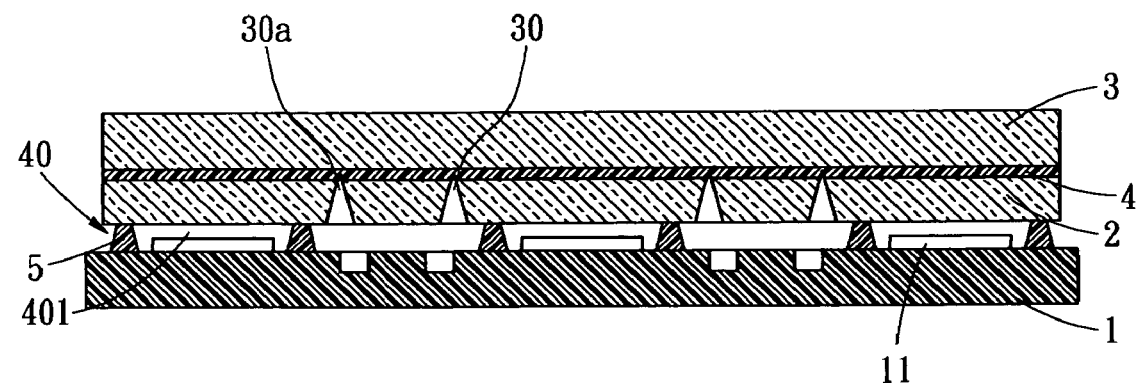
Figure 13:
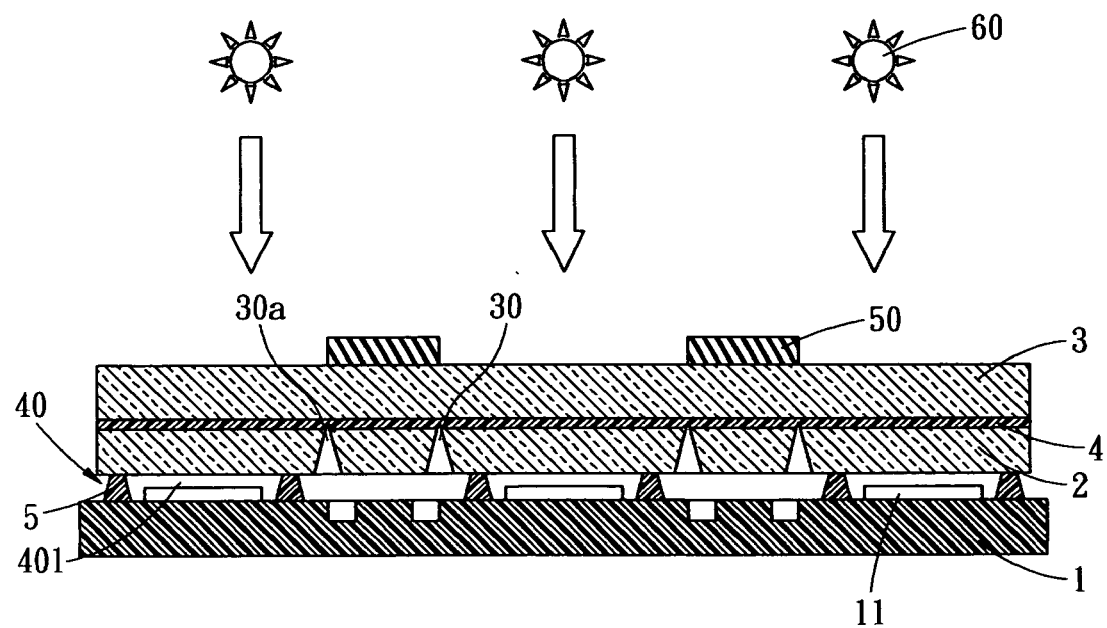
FIG. 13 to FIG. 16 illustrate the lithography process of manufacturing the image sensor of the present invention.
Figure 14:
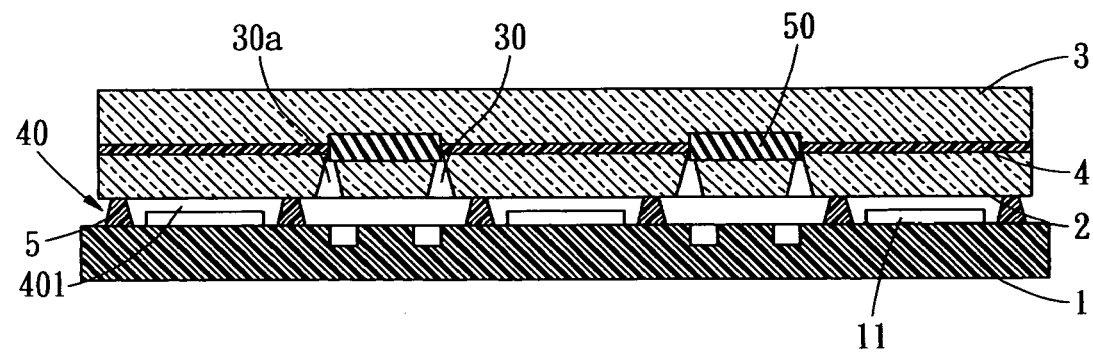
Figure 15:
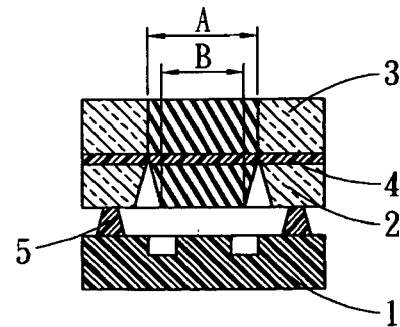
Figure 16:
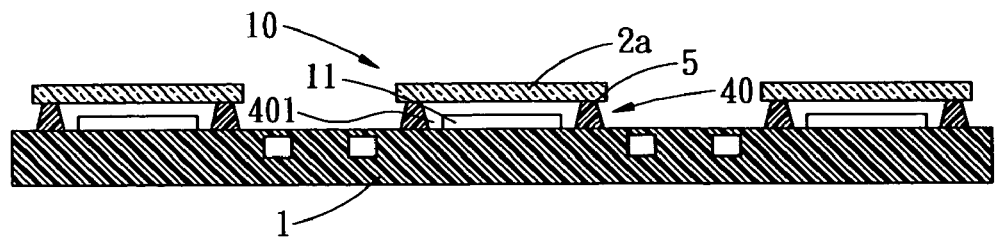

Referring to FIG. 11 and FIG. 12, the grinding of microchip thickness is illustrated. As shown, the transparent layer and the microchip 1 are first combined and then sent to a grinding machine (not shown). The microchip 1 is ground to a thinner thickness. During the process of grinding the microchip 1, equal pressure can be applied to the surface of the substrate 3 provided that glass is not eliminated.

The grinding surface of the microchip 1 is thus homogeneous which would not damage the microchip 1.

Referring to FIG. 13 to FIG. 16, the lithography process of manufacturing the image sensor of the present invention is illustrated. As shown, after the transparent layer and the microchip 1 are combined, the lithography process for manufacturing the image sensor of the present invention is performed. A photo resist (photo mask) 50 is printed on the other surface of the substrate 3. The photo resist 50 is located between the two marks 30, 30a. The regions on the substrate 3 that are not covered by the photo resist 50 are transparent for the light source 60. After being exposed to the light source 60, the first adhesive 4 not covered by the photo resist 50 is dried out, while the first adhesive 4 covered by the photo resist 50 remains adhesive. In addition, the area A between the bottom portions of the two marks 30, 30a is larger than the area B between the openings of the two marks 30, 30a. Therefore, the substrate 3 and part of the transparent material 2 are vertically detached, thereby forming a package for each micro-lens 11 of the microchip 1.

Figure 17:
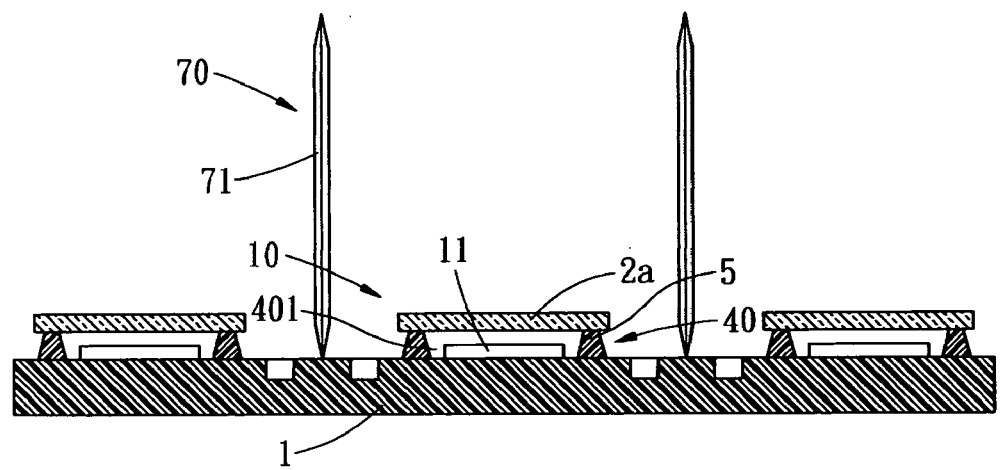
FIG. 17 and FIG. 18 illustrate the cutting process after the microchip is packaged, according to the present invention.
Figure 18:
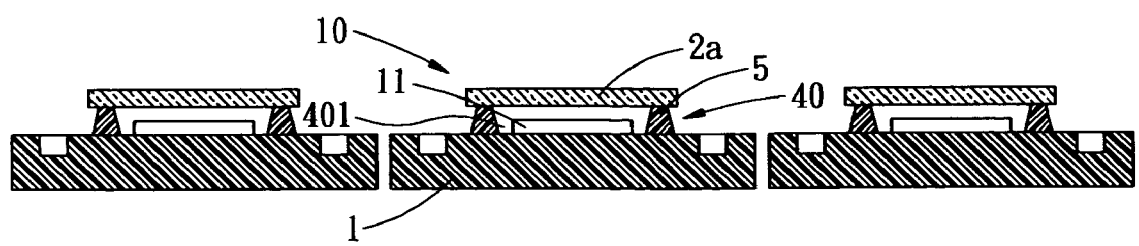

Referring to FIG. 17 and FIG. 18, there is illustrated the cutting process after the microchip is packaged. As shown, the microchip is sent to the cutting or carving machine 70 after each micro-lens 11 of the microchip 1 is packaged. By employing the rotating cutter 71, such as a diamond cutter, the microchip 1 is cut to form individual image sensors 10.

According to the descriptions given above, it is appreciated that the transparent layer of the present invention is fabricated in a separate process. The transparent layer is then combined with the microchip 1. The combination then undergoes the lithography process and the cutting process to form and complete packaged image sensors. In this manner, the image sensors of the present invention can be manufactured automatically, thereby reducing the manufacturing cost and the damage rate. An improved process for manufacturing image sensors is thus obtained.

Since, any person having ordinary skill in the art may readily find various equivalent alterations or modifications in light of the features as disclosed above, it is appreciated that the scope of the present invention is defined in the following claims. Therefore, all such equivalent alterations or modifications without departing from the subject matter as set forth in the following claims is considered within the spirit and scope of the present invention.

What is claimed is:

1. A method for packaging an image sensor, comprising the steps in the order named of:
 a) providing a substrate;
 b) forming a first adhesive on one surface of the substrate;
 c) attaching a transparent material on the first adhesive;
 d) cutting or carving the surface of the transparent material to a depth penetrating the transparent material while not penetrating the first adhesive;
 e) cleaning the cut or carved surface of the transparent material;
 f) depositing a frame glue on the transparent material; and
 g) combining the transparent material with a microchip that includes a plurality of micro-lenses, wherein the micro-lens is packaged within the transparent material.

2. The method as recited in claim 1, wherein the substrate is made of transparent material.

3. The method as recited in claim 2, wherein the transparent material is made of glass material.

4. The method as recited in claim 2, wherein the first adhesive is an ultraviolet curable two-sided glue or a transparent thermal solvable two-sided glue.

5. The method as recited in claim 1, wherein the transparent material is made of glass material.

6. The method as recited in claim 1, wherein transparent material is cut or carved into a plurality of transparent regions arranged as an array.

7. The method as recited in claim 1, further comprising cleaning the entire transparent material by employing ultrasonic techniques.

8. The method as recited in claim 1, further comprising homogeneously printing a second adhesive on each transparent region of the transparent material to form a shielding layer.

9. The method as recited in claim 8, wherein the second adhesive is mad of epoxy material.

10. The method as recited in claim 8, wherein a space is formed between the shielding layer and the transparent region of the transparent material.

11. A method for packaging an image sensor, comprising the steps of:
providing a substrate;
forming a first adhesive on one surface of the substrate;
attaching a transparent material on the first adhesive;
cutting or carving the surface of the transparent material to a depth penetrating the transparent material while not penetrating the first adhesive;
cleaning the cut or carved surface of the transparent material;
depositing a frame glue on the transparent material;
combining the transparent material with a microchip that includes a plurality of micro-lenses, wherein the micro-lens is packaged within the transparent material;
grinding the microchip, performing a lithography process, detaching the substrate with a portion of the first adhesive after performing the lithography process; and
finishing the image sensor by cutting or carving.

12. The method as recited in claim 11, wherein equal pressure is applied to the surface of the substrate so that the grinded surface of the microchip is homogeneous without damaging the microchip.

13. The method as recited in claim 11, wherein the lithography process includes printing a photo resist on the transparent material between two cutting marks.

14. The method as recited in claim 13, wherein the first adhesive covered by the photo resist is still adhesive after the lithography process, while an area between the bottom portions of the two marks is larger than an area between openings of the two marks, which can vertically detach the substrate and part of the transparent material.

\* \* \* \* \*